United States Patent
Chang et al.

(10) Patent No.: US 10,153,288 B2
(45) Date of Patent: Dec. 11, 2018

(54) DOUBLE METAL LAYOUT FOR MEMORY CELLS OF A NON-VOLATILE MEMORY

(71) Applicant: Taiwan Semiconductor Manufacturing Company Limited, Hsinchu (TW)

(72) Inventors: Meng-Sheng Chang, Hsinchu County (TW); Bai-Mei Chang, Hsinchu County (TW); Shao-Yu Chou, Hsinchu County (TW); Liang Chuan Chang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/422,596

(22) Filed: Feb. 2, 2017

(65) Prior Publication Data

US 2017/0345827 A1 Nov. 30, 2017

Related U.S. Application Data

(60) Provisional application No. 62/343,244, filed on May 31, 2016.

(51) Int. Cl.
| | |
|---|---|
| H01L 29/00 | (2006.01) |
| H01L 23/528 | (2006.01) |
| H01L 27/112 | (2006.01) |
| H01L 21/8234 | (2006.01) |
| G11C 17/16 | (2006.01) |
| G11C 17/18 | (2006.01) |

(52) U.S. Cl.
CPC ........ H01L 27/11206 (2013.01); G11C 17/16 (2013.01); G11C 17/18 (2013.01); H01L 21/823475 (2013.01)

(58) Field of Classification Search
CPC ......... H01L 27/11206; H01L 27/11213; H01L 27/115; H01L 23/528; H01L 23/5256; H01L 21/823475; G01C 17/18; G01C 17/16
USPC ................ 257/209, 379, 529, 530, E21.002; 327/199; 337/186; 365/96, 148, 200, 365/225.7; 438/131, 132, 215, 281, 333, 438/467, 600, 601
See application file for complete search history.

(56) References Cited

U.S. PATENT DOCUMENTS

| | | | | |
|---|---|---|---|---|
| 4,689,494 A | * | 8/1987 | Chen ....................... | G11C 29/80 326/13 |
| 5,387,823 A | * | 2/1995 | Ashizawa ............... | G11C 17/18 326/106 |
| 5,590,085 A | * | 12/1996 | Yuh ....................... | G11C 29/783 365/200 |

(Continued)

*Primary Examiner* — Dao H Nguyen
(74) *Attorney, Agent, or Firm* — Jones Day

(57) ABSTRACT

A non-volatile memory having a double metal layout is provided that includes a first fuse fabricated on a first conductive layer of the integrated circuit, a second fuse fabricated on a second conductive layer of the integrated circuit, and a transistor fabricated on front-end-of-the-line (FEOL) structure of the integrated circuit. A first memory cell of the non-volatile memory is provided by a first memory circuit comprising the first fuse and the transistor, and a second memory cell of the non-volatile memory is provided by a second memory circuit comprising the second fuse and the transistor.

20 Claims, 6 Drawing Sheets

(56) References Cited

U.S. PATENT DOCUMENTS

| | | | | |
|---|---|---|---|---|
| 5,703,824 A * | 12/1997 | Isa | ................. | G11C 29/83 365/189.05 |
| 5,712,588 A * | 1/1998 | Choi | ................. | G11C 17/16 327/525 |
| 5,848,003 A * | 12/1998 | Nishikawa | ............. | G11C 29/80 365/200 |
| 7,525,077 B2 * | 4/2009 | Kim | ................. | H01L 27/14603 250/208.1 |
| 8,105,886 B2 * | 1/2012 | Otsuka | ............... | H01L 23/5256 438/132 |
| 2005/0093577 A1 * | 5/2005 | Nguyen | ........... | H03K 3/356008 326/105 |
| 2005/0285224 A1 * | 12/2005 | Tsutsui | ............... | H01L 23/5256 257/531 |
| 2008/0251884 A1 * | 10/2008 | Chung | ................. | G11C 17/16 257/529 |

* cited by examiner

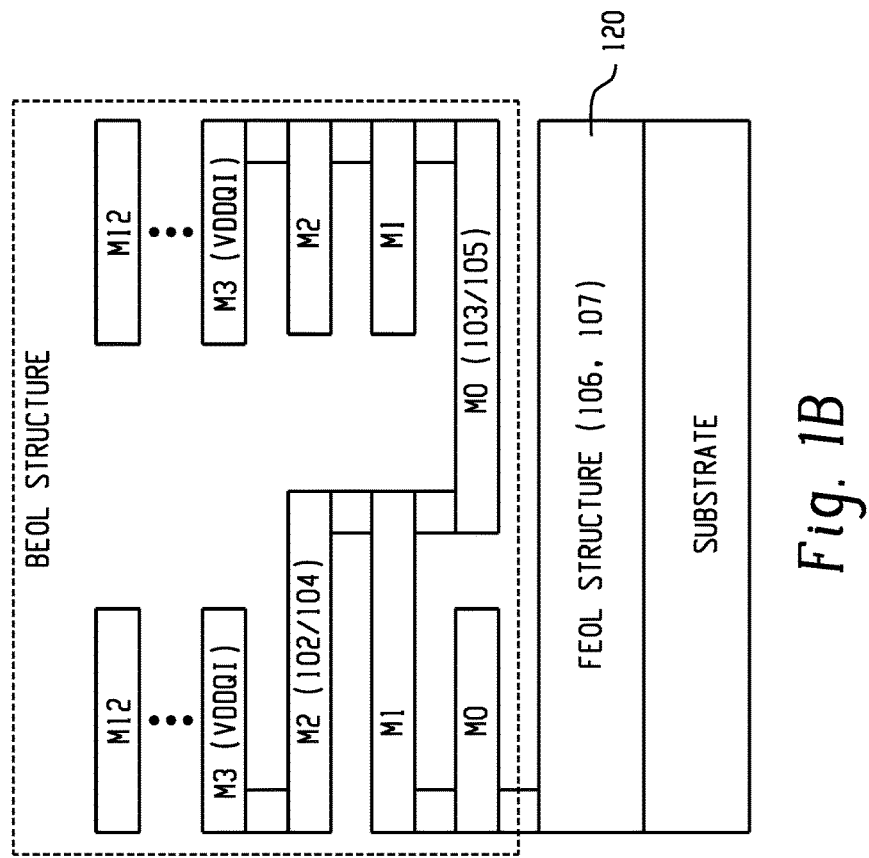
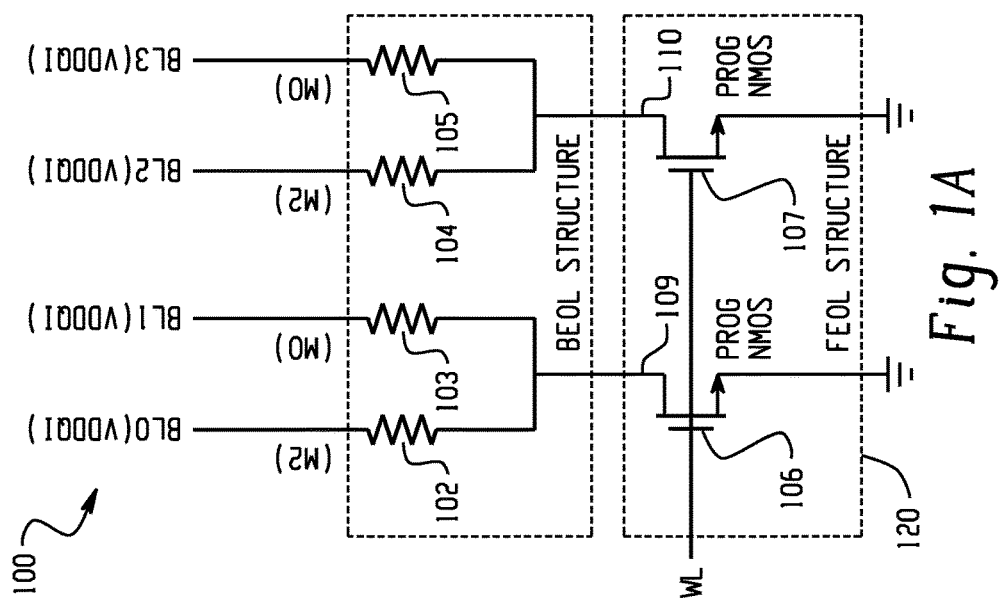
Fig. 1B
Fig. 1A

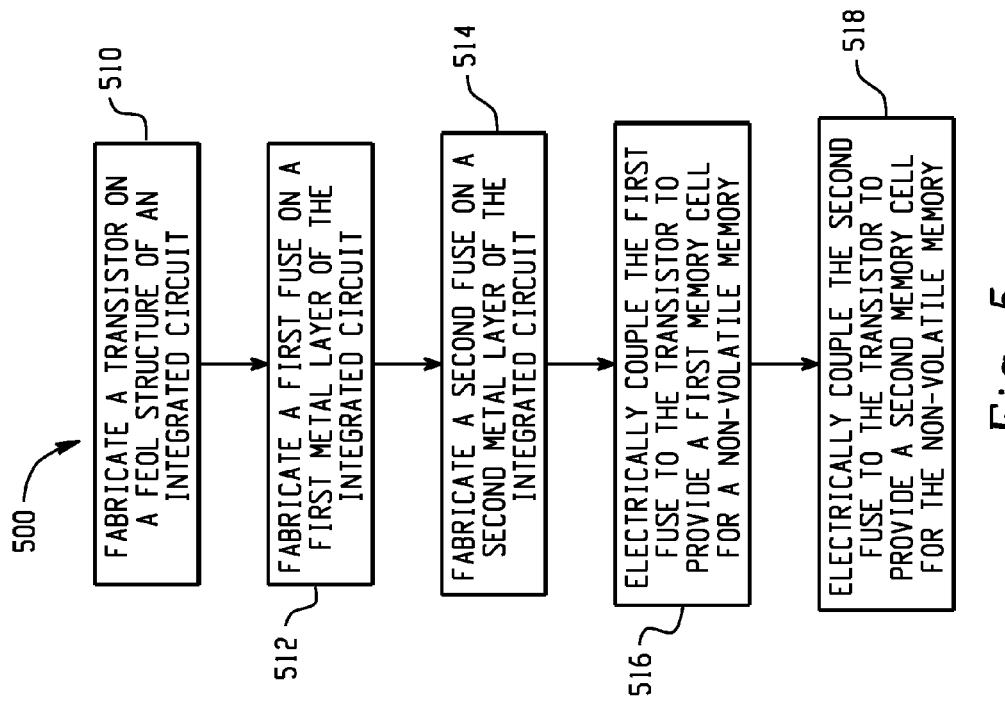
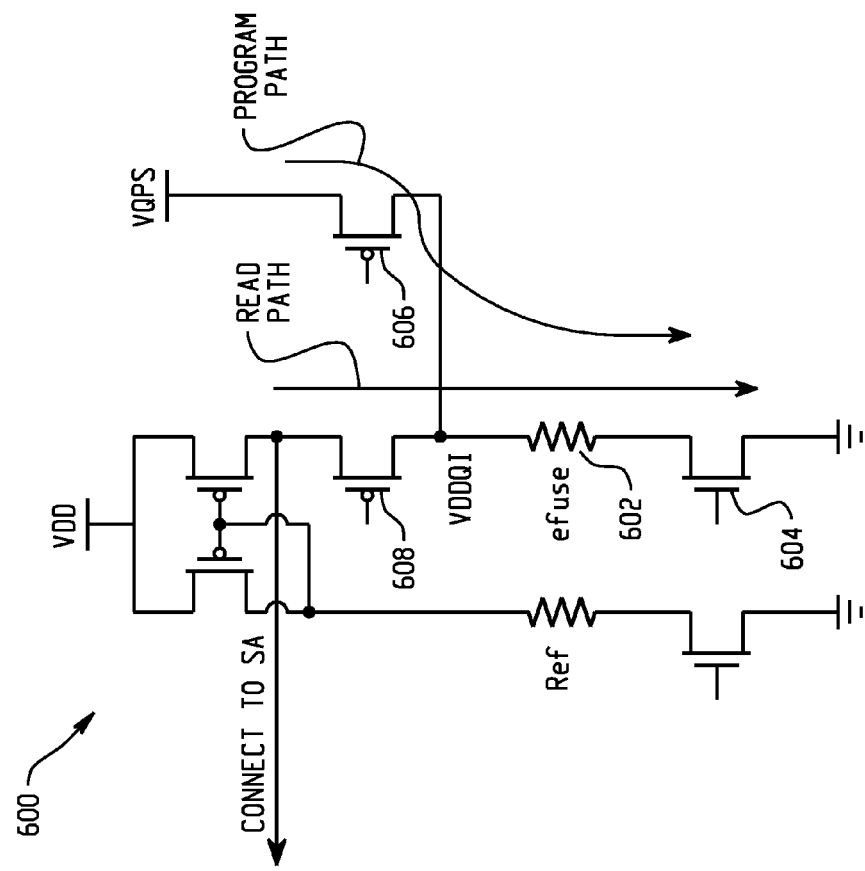
Fig. 6
Fig. 5

DOUBLE METAL LAYOUT FOR MEMORY CELLS OF A NON-VOLATILE MEMORY

CROSS-REFERENCE TO RELATED APPLICATIONS

This application claims priority to U.S. Provisional Patent Application No. 62/343,244, filed on May 31, 2016, entitled "Double Metal Layout for Reduced Efuse Cell Area," which is incorporated herein by reference in its entirety.

BACKGROUND

Many integrated circuits (ICs) are made up of millions of interconnected devices, such as transistors, resistors, capacitors, and diodes, on a single chip of semiconductor substrate. It is generally desirable that ICs operate as fast as possible, and consume as little power as possible. Semiconductor ICs often include one or more types of memory, such as complementary metal-oxide-semiconductor (CMOS) memory, anti-fuse memory, and Efuse memory.

One-time-programmable ("OTP") memory elements are used in ICs to provide non-volatile memory ("NVM"). Data in NVM are not lost when the IC is turned off. NVM allows an IC manufacturer to store lot numbers and security data on the IC, for example, and is useful in many other applications. One type of NVM utilizes electrical fuse (eFuse) technology.

EFuses are typically integrated into semiconductor ICs by using a narrow strip (commonly referred to as a "fuse link") of conducting material (metal, poly-silicon, etc.) between two pads, generally referred to as anode and cathode. Applying a program current to the eFuse destroys (i.e., fuses) the link, thus changing the resistivity of the eFuse. This is commonly referred to as "programming" the eFuse.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a circuit diagram of example memory cells for a non-volatile memory.

FIG. 1B is a diagram depicting a sectional view of an example memory.

FIG. 5 is a flow diagram of an example method for manufacturing memory cells for a non-volatile memory.

FIG. 6 is a diagram of an example circuit for programming and reading an eFuse memory cell.

DETAILED DESCRIPTION

Figure 2:
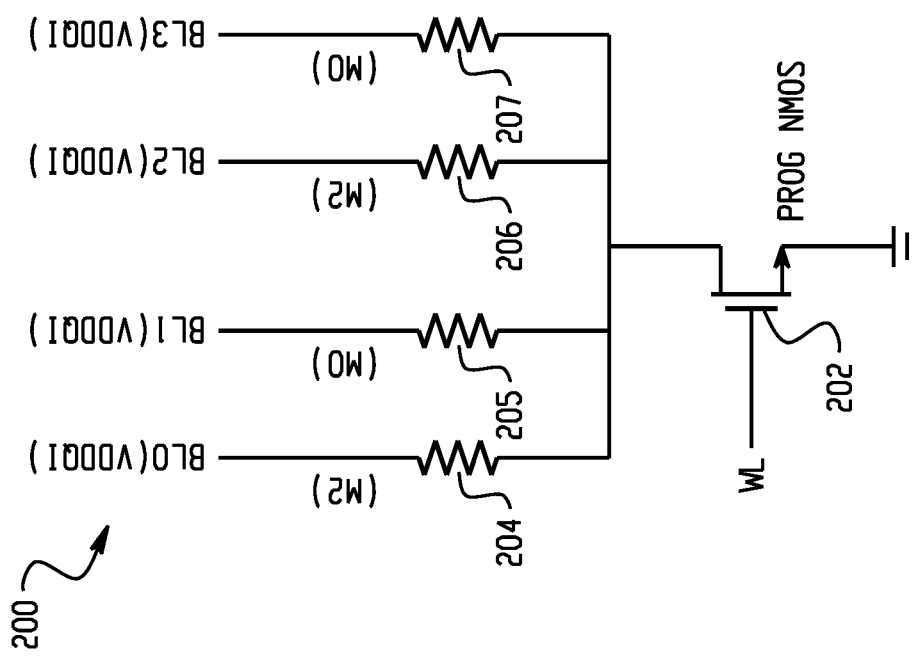
FIG. 2 is a circuit diagram of another example of memory cells for a non-volatile memory.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Systems and methods as described herein provide a non-volatile memory having a double metal layout. A non-volatile memory, such as a read-only memory ("ROM"), includes a plurality of memory cells, each of which includes a transistor connected to a word line and an eFuse connected to a bit line. When programming a "1," the eFuse is typically blown by applying write voltages to the word and bit lines (e.g., to melt the middle portion of the fuse link). A conventional ROM includes a substrate, a first conductive (e.g., metal) layer (M1) above the substrate, and a second conductive (e.g., metal) layer (M2) above M1. The eFuses of the memory cells of a conventional ROM are typically disposed in M2 because, based on experience, the yield is higher when compared to eFuses formed in other metal layers (M1, M2, . . . M12). The transistors of the memory cells are typically disposed in the same semiconductor layer under M1.

FIG. 1A is a circuit diagram of example memory cells 100 for a non-volatile memory. FIG. 1B is a diagram depicting a sectional view of an example memory (or integrated circuit). As illustrated in FIG. 1B, the memory, e.g., a non-volatile memory, includes a substrate, a back-end-of-the-line (BEOL) structure above the substrate, and a front-end-of-the-line (FEOL) structure between the substrate and the BEOL structure. A FEOL structure is a structure that is fabricated during a first portion of IC fabrication in which individual devices (e.g., transistors, capacitors, resistors, etc.) are patterned in one or more semiconductor materials. A BEOL structure is a structure that is fabricated during a second portion of IC fabrication in which electrical connections are made to the individual devices, for example using patterned metal layers.

The BEOL structure includes metal layers M0, M1, M2, M3, M4, . . . MN sequentially arranged from bottom to top (where N is an integer and is 12 in some embodiments). The memory cells 100, as illustrated in FIG. 1A, are provided using a double metal layout in which two metal layers, e.g., M0 and M2, are used for adjacent fuse elements (eFuses). Each memory cell, with further reference to FIG. 1B, is formed by the combination of an Efuse 102-105 and a transistor 106, 107 (e.g., an NMOS transistor), with each transistor 106, 107 on a FEOL structure 120 supporting two adjacent eFuses 102-105 on different conductive (e.g., metal) layers, i.e., M0 and M2. For example, in the illustrated diagrams, a first memory cell that includes eFuse 102/104 on metal layer M2 and a second memory cell that includes eFuse 103/105 on metal layer M0 both share a common programming transistor 106 on FEOL structure 120. In this way, by providing adjacent eFuses on different metal layers (M2 and M0), the required memory cell area may be reduced, e.g., by about 23%, compared to a conventional non-volatile memory in which the eFuses are all included on the same metal layer (e.g., M2). Adjacent memory cells may share a common transistor, as shown in the illustrated embodiment, in order to provide an optimized layout in which memory cell size is reduced but a sufficiently large transistor size is maintained (a large size transistor is often desirable.) It should be understood that although eFuses are fabricated on the metal layers M0, M2 in the illustrated embodiment, other embodiments may include eFuses fabricated on another two metal layers, e.g., M1, M3; M2, M4; M3, M5; etc.

The illustrated example 100 shows four memory cells from a non-volatile memory. Adjacent eFuses for the memory cells are fabricated on different layers, M0 and M2, of an integrated circuit, and may partially overlap (as described below with reference to FIGS. 3 and 4.) The two metal layers, M0 and M2, may have substantially the same resistance, such that there is no appreciable electrical difference between fuses fabricated on M0 or M2. Each eFuse 102-105 is connected at one end to a bit line (BL0-BL3) of the non-volatile memory and at the other end to a current carrying node 109, 110 of a programming transistor 106, 107, which as shown in the illustrated embodiment may be a programming NMOS transistor (PROG NMOS). The gate node of each programming transistor 106, 107 is connected to a word line (WL) of the non-volatile memory. A memory cell of the non-volatile memory is programmed by applying write voltages to the bit line (BL0-BL3 VDDQI) and word line (WL) corresponding to a particular fuse 102-105. An example circuit for programming and reading an eFuse memory cell is described below with reference to FIG. 6.

Specifically, in the illustrated example, a first memory cell is provided by a first eFuse 102 fabricated on a first metal layer (M2) of an integrated circuit and a first transistor 106 fabricated on a FEOL structure of the integrated circuit. A second memory cell is provided by a second eFuse 103 fabricated on a second metal layer (M0) of the integrated circuit and the first transistor 106. A third memory cell is provided by a third eFuse 104 fabricated on the first metal layer (M2) and a second transistor 107 fabricated on the FEOL structure of the integrated circuit. A fourth memory cell is provided by a fourth eFuse 105 fabricated on the second metal layer (M0) and the second transistor 107. The first metal layer (M2), the second metal layer (M0) and the FEOL structure are each on different layers of the integrated circuit.

FIG. 2 is a circuit diagram of another example of memory cells 200 for a non-volatile memory. In this example 200, a common programming transistor 202 is shared by four memory cells. Similar to the example shown in FIG. 1A, the memory cells 200 are provided using a double metal layout in which two conductive (e.g., metal) layers, e.g., M0 and M2, are used for adjacent fuse elements (eFuses). Specifically, in the illustrated example, a first memory cell is provided by a first eFuse 204 fabricated on a first metal layer (M2) of an integrated circuit and the common transistor 202 fabricated on a FEOL structure of the integrated circuit. A second memory cell is provided by a second eFuse 205 fabricated on a second metal layer (M0) of the integrated circuit and the common transistor 202. A third memory cell is provided by a third eFuse 206 fabricated on the first metal layer (M2) and the common transistor 202. A fourth memory cell is provided by a fourth eFuse 207 fabricated on the second metal layer (M0) and the common transistor 202. It should be appreciated that by sharing a common programming transistor 202 with four adjacent eFuses 204-207, the example shown in FIG. 2 may provide a further reduction, e.g., about 30%, in the overall memory cell area and/or a larger transistor size compared to the example illustrated in FIG. 1A. In other examples, addition reduction in memory cell area may be provided by sharing a common programming transistor with more than four adjacent eFuses.

Figure 3:
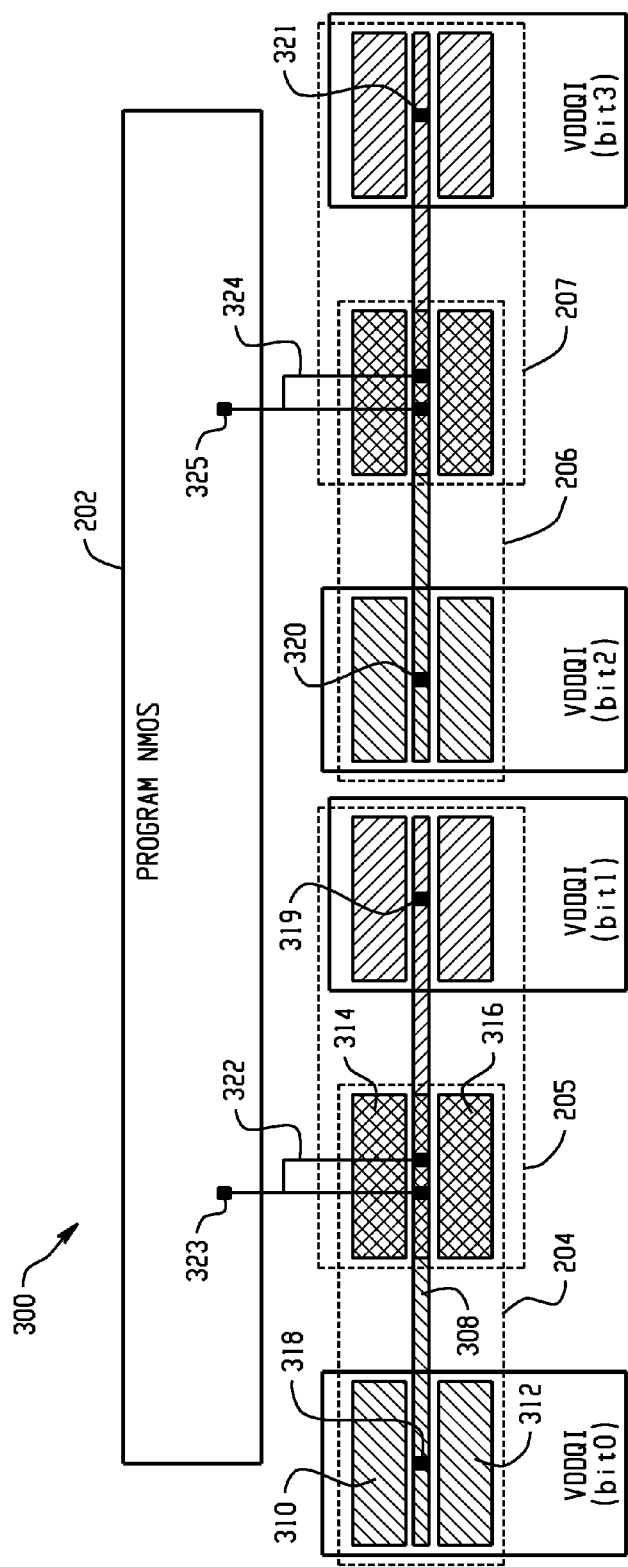
FIG. 3 is a diagram depicting a top view of an example integrated circuit layout for memory cells of a non-volatile memory.
Figure 4A:
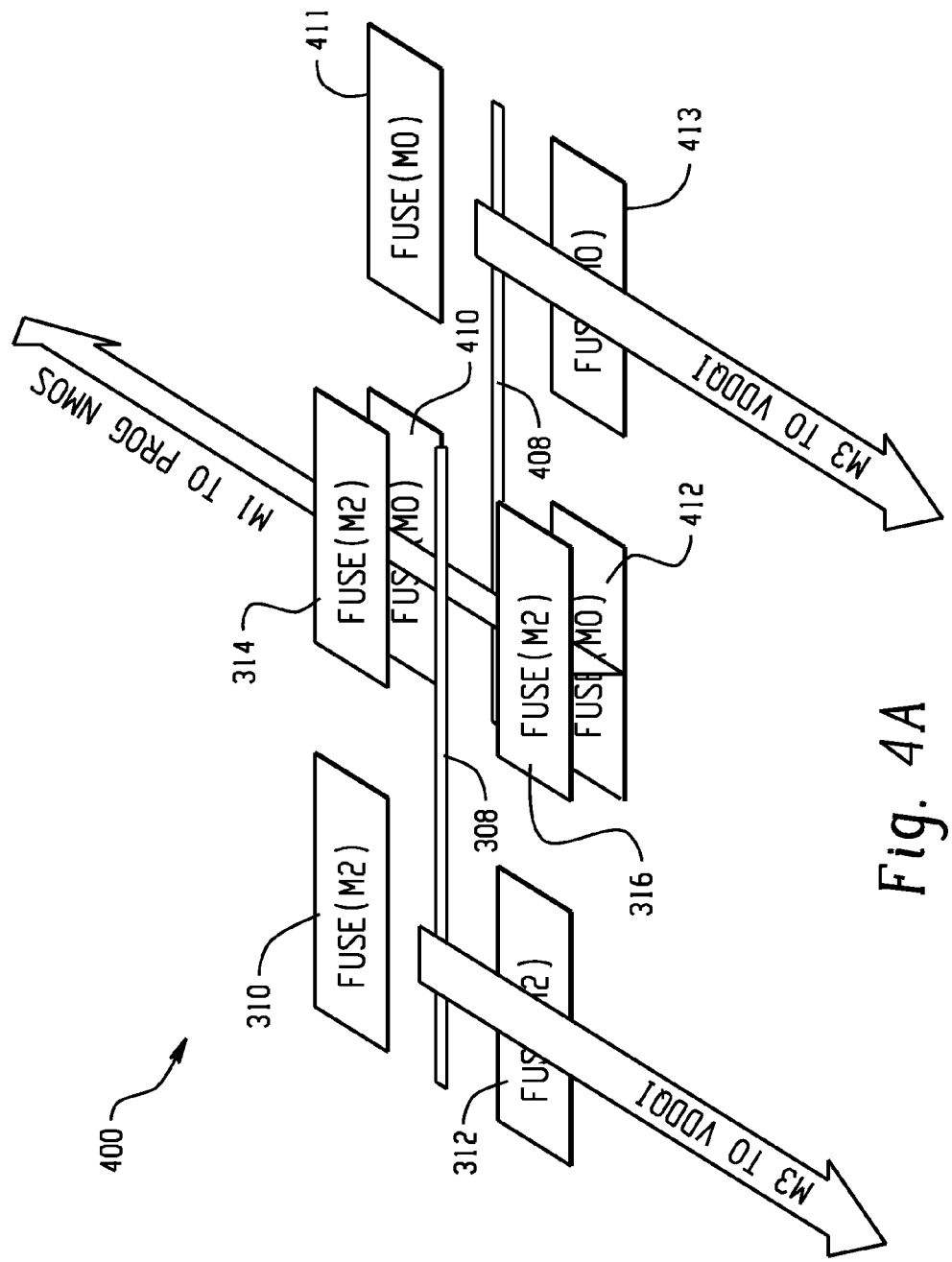
FIG. 4A is a diagram depicting a three-dimensional angled view of an example integrated circuit layout for memory cells of a non-volatile memory.

FIGS. 3 and 4A are diagrams of an example integrated circuit layout for memory cells for a non-volatile memory. FIG. 3 shows a top view 300 of the example layout, and FIG. 4A shows a three-dimensional angled view 400 of the example layout.

With reference first to FIG. 3, this figure illustrates a top layout view 300 of memory cells that are fabricated with a double metal layout in which two conductive (e.g., metal) layers, e.g., M0 and M2, are used for adjacent fuse elements (eFuses). The example layout illustrated in FIG. 3 includes four memory cells that share one common programming transistor 202, as shown in the circuit diagram of in FIG. 2.

The memory cells in the illustrated example include four eFuses 204-207, which are identified in FIG. 3 by four dotted boxes, each of which surrounds the components of an eFuse. Each eFuse 204-207 in the illustrated example includes a thin fuse link portion and four metallic spacer portions, with two spacer portions adjacent to each end of the fuse link. For example, eFuse 204 includes a fuse link portion 308, two metal spacer portions 310, 312 located adjacent to one end of the fuse link 308 and two metal spacer portions 314, 316 located adjacent to the other end of the fuse link 308. The metal spacer portions 310, 312, 314, 316 are included to protect surrounding circuitry when the eFuse 204 is programmed by applying write voltages to word and bit lines connected to respective ends of the fuse link 308.

As explained above with reference to FIGS. 1A and 2, the eFuses in adjacent memory cells are fabricated on different metal layers (e.g., M0 and M2) of the integrated circuit. In the example shown in FIG. 3, eFuses 204 and 206 are fabricated on metal layer M2, and eFuses 205 and 207 are fabricated on metal layer M0. In addition, portions of adjacent eFuses on different metal layers are overlapped to reduce the overall cell area. In the illustrated example, two metal spacer portions and a section of the fuse link for each eFuse 204-207 are overlapped with an adjacent eFuse. Overlapping portions of the eFuses 204-207 are illustrated by cross-hatching in FIG. 3.

The overlapping portions of adjacent eFuses fabricated on different metal layers (M0 and M2) is further illustrated by the three-dimensional diagram 400 shown in FIG. 4A. FIG. 4A illustrates the layout for two adjacent eFuses, for example eFuse 204 and eFuse 205 in FIG. 3. Specifically, the example illustrated in FIG. 4A includes a first eFuse that includes a fuse link 308 and four conductive (e.g., metal) spacers 310-316, and a second eFuse that includes a fuse link 408 and four conductive (e.g., metal) spacers 410-413. As shown, two of the metal spacers 314 and 316 and a portion of the fuse link 308 for the first eFuse fabricated on metal layer M2 overlaps two of the metal spacers 410 and 412 and a portion of the fuse link 408 for the second eFuse fabricated on metal layer M0.

Figure 4B:
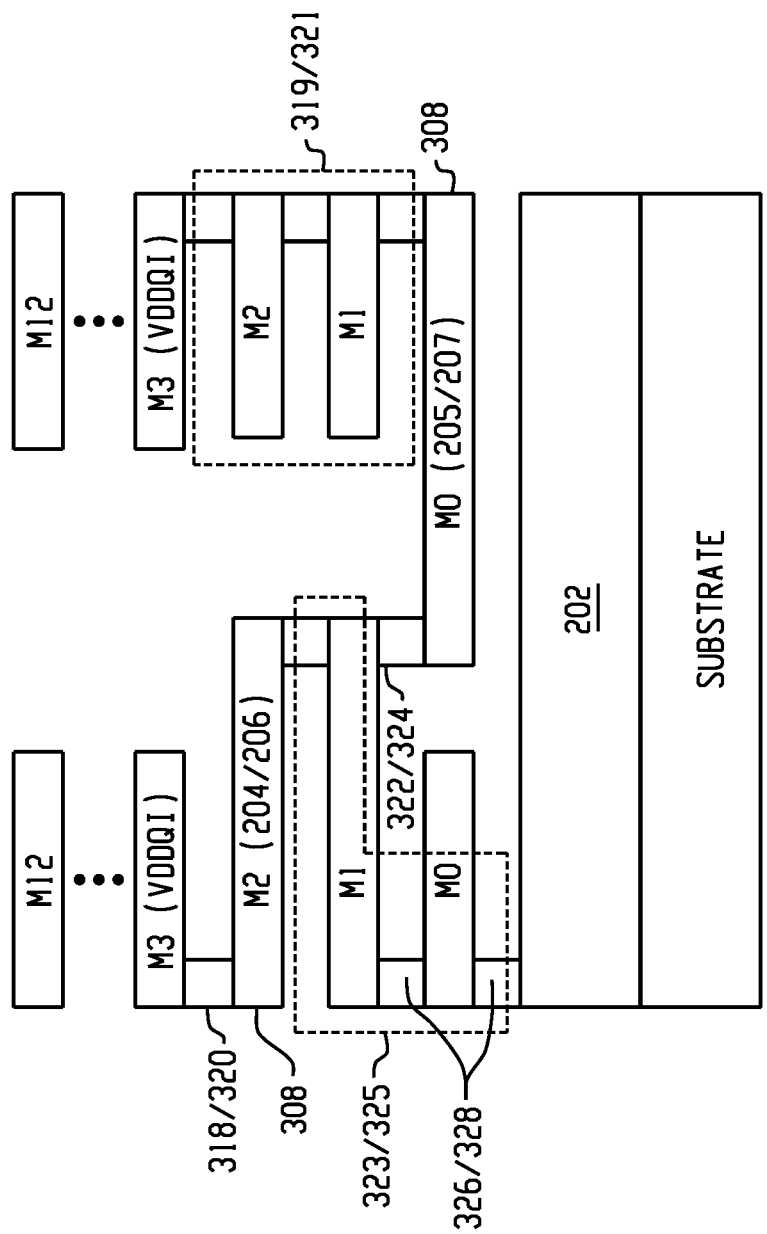
FIG. 4B is a diagram depicting a sectional view of another example memory.

FIG. 4B is a diagram depicting a sectional of another example memory. With reference again to FIG. 3, the fuse link (e.g., 308) for each eFuse 204-207 is electrically connected at one end to a bit line (VDDQI) and at the other end to the common programming transistor 202 (e.g., as shown in the circuit diagram of FIG. 2.) The electrical connections between each eFuse 204-207 and the bit line (VDDQI) and the common programming transistor 202 may be provided using interlayer connections (i.e., vias) or a combination of interlayer connections and one or more interconnection layers (e.g., M1 and M3) of the integrated circuit. For example, in the illustrated embodiment 300 and FIG. 4B, one end of the fuse link for the eFuse 204/206 is connected by an interlayer connection (i.e., via) 318/320 to a bit line (VDDQI) on another layer (M3) of the integrated circuit. The other end of the fuse link for the eFuse 204/205 in the illustrated example 300 and FIG. 4B is connected by conductive traces 323/325 to the common programming transistor 202, which lies on a FEOL structure of the integrated circuit. Further, one end of the fuse link for the eFuse 205/207 is connected by conductive traces 319/321 to another bit line (VDDQI) on the layer (M3) of the integrated circuit. The other end of the fuse link for the eFuse 205/207 is connected by an interlayer connection (i.e., via) 322/324 to the common programming transistor 202 through the conductive traces 323/325 and interlayer connections (i.e., vias) 326/328.

FIG. 5 is a flow diagram of an example method 500 for manufacturing memory cells for a non-volatile memory. The method 500 may, for example, be used to fabricate the memory cells illustrated in FIGS. 1-4. At 510, a transistor is fabricated on one or more semiconductor layers (e.g., a FEOL structure) of an integrated circuit. At 512, a first fuse is fabricated on a first conductive layer of the integrated circuit. At 514, a second fuse is fabricated on a second conductive layer of the integrated circuit. The first fuse is electrically coupled to the transistor, at 516, to provide a first memory cell for the non-volatile memory. The second fuse is electrically coupled to the transistor, at 518, to provide a second memory cell for the non-volatile memory.

FIG. 6 is a diagram of an example circuit 600 for programming and reading an eFuse memory cell, such as the eFuse memory cells described above with reference to FIGS. 1-5. The eFuse memory cell in the illustrated example includes an eFuse 602 and a transistor 604. The example circuit 600 includes two circuit paths—a read path and a program path—that are selectively coupled to the VDDQI node by a pair of transistors 606, 608, depending on whether the circuit 600 is in a read mode or a programming mode.

When in programming mode, the transistor pair 606, 608 is configured to disconnect the read path and to couple the VDDQI node to a programming voltage, VQPS. The programming voltage (VQPS) is large enough to provide a programming current through the eFuse that causes the eFuse to be blown.

When in read mode, the transistor pair 606, 608 is configured to disconnect the program path and to couple the VDDQI node to a sense amplifier circuit. The sense amplifier circuit is configured to determine whether a logic high (H) or a logic low (L) voltage exists at the VDDQI node based on the current through the eFuse. When the eFuse has been programmed (i.e., blown), the eFuse resistance will be high, and the VDDQI voltage will be high (VDDQI=H). If the eFuse has not been blown, then the VDDQI voltage will be low (VDDQI=L). As a result, the sense amplifier can distinguish between a read0 and a read1.

In an embodiment, an integrated circuit includes a first fuse fabricated on a first conductive layer of the integrated circuit, a second fuse fabricated on a second conductive layer of the integrated circuit, and a transistor fabricated on one or more semiconductor layers (e.g., a FEOL structure) of the integrated circuit. A first memory cell of a non-volatile memory is provided by a first memory circuit comprising the first fuse and the transistor, and a second memory cell of the non-volatile memory is provided by a second memory circuit comprising the second fuse and the transistor.

In another embodiment, a method of manufacturing an integrated circuit includes fabricating a transistor on a front-end-of-the-line (FEOL) structure of the integrated circuit, fabricating a first fuse on a first conductive layer of a back-end-of-the-line (BEOL) structure of the integrated circuit, and fabricating a second fuse on a second conductive layer of the BEOL structure of the integrated circuit. The first fuse is electrically coupled to a current-carrying node of the transistor to provide a first memory cell for a non-volatile memory, and the second memory cell is electrically coupled to the current-carrying node of the transistor to provide a second memory cell for the non-volatile memory.

In an additional embodiment, a non-volatile memory includes a plurality of memory cells that include a first memory cell and a second memory cell. The first memory cell includes a first eFuse fabricated on a first conductive layer of the non-volatile memory. The second memory cell includes a second eFuse fabricated on a second conductive layer of the integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a first fuse fabricated on a first conductive layer of the integrated circuit;
a second fuse fabricated on a second conductive layer of the integrated circuit, wherein the first and second conductive layers are different layers of the integrated circuit; and
a transistor fabricated on a front-end-of-the-line (FEOL) structure of the integrated circuit;
wherein a first memory cell of a non-volatile memory is provided by a first memory circuit comprising the first fuse and the transistor, and a second memory cell of the non-volatile memory is provided by a second memory circuit comprising the second fuse and the transistor.

2. The integrated circuit of claim 1, further comprising:
a third fuse fabricated on the first conductive layer of the integrated circuit; and
a fourth fuse fabricated on the second conductive layer of the integrated circuit;
wherein a third memory cell of the non-volatile memory is provided by a third memory circuit comprising the third fuse and the transistor, and a fourth memory cell of the non-volatile memory is provided by a fourth memory circuit comprising the fourth fuse and the transistor.

3. The integrated circuit of claim 1, further comprising:
a third fuse fabricated on the first conductive layer of the integrated circuit;
a fourth fuse fabricated on the second conductive layer of the integrated circuit; and
a second transistor fabricated on the FEOL structure of the integrated circuit;
wherein a third memory cell of the non-volatile memory is provided by a third memory circuit comprising the third fuse and the second transistor, and a fourth memory cell of the non-volatile memory is provided by a fourth memory circuit comprising the fourth fuse and the second transistor.

4. The integrated circuit of claim 1, wherein the non-volatile memory is a read-only memory (ROM).

5. The integrated circuit of claim 1, wherein at least a portion of the first fuse is fabricated on an area of the first conductive layer that is above at least a portion of the second fuse fabricated on the second conductive layer.

6. The integrated circuit of claim 1, wherein the first fuse and the second fuse are coupled to a current-carrying node of the transistor.

7. The integrated circuit of claim 6, wherein a first bit line of the non-volatile memory is coupled to the first fuse, a second bit line of the non-volatile memory is coupled to the second fuse, and a word line of the non-volatile memory is coupled to a gate node of the transistor.

8. The integrated circuit of claim 1, wherein the first and second fuses each comprise a fuse link and a plurality of conductive spacers, wherein the plurality of conductive spacers electrically isolate the fuse link from one or more other semiconductor components of the integrated circuit.

9. A method of manufacturing an integrated circuit, comprising:
   fabricating a transistor on a front-end-of-the-line (FEOL) structure of the integrated circuit;
   fabricating a first fuse on a first conductive layer of a back-end-of-the-line (BEOL) structure of the integrated circuit;
   fabricating a second fuse on a second conductive layer of the BEOL structure of the integrated circuit, wherein the first and second conductive layers are different layers of the integrated circuit;
   electrically coupling the first fuse to a current-carrying node of the transistor to provide a first memory cell for a non-volatile memory; and
   electrically coupling the second fuse to the current-carrying node of the transistor to provide a second memory cell for the non-volatile memory.

10. The method of claim 9, further comprising:
    fabricating a third fuse on the first conductive layer of the integrated circuit;
    fabricating a fourth fuse on the second conductive layer of the integrated circuit;
    electrically coupling the third fuse to the transistor to provide a third memory cell for the non-volatile memory; and
    electrically coupling the fourth fuse to the transistor to provide a fourth memory cell for the non-volatile memory.

11. The method of claim 9, further comprising:
    fabricating a second transistor on the FEOL structure of the integrated circuit;
    fabricating a third fuse on the first conductive layer of the integrated circuit;
    fabricating a fourth fuse on the second conductive layer of the integrated circuit;
    electrically coupling the third fuse to the second transistor to provide a third memory cell for the non-volatile memory; and
    electrically coupling the fourth fuse to the second transistor to provide a fourth memory cell for the non-volatile memory.

12. The method of claim 9, wherein the non-volatile memory is a read-only memory (ROM).

13. The method of claim 9, wherein at least a portion of the first fuse is fabricated on an area of the first conductive layer that is above at least a portion of the second fuse fabricated on the second conductive layer.

14. The method of claim 9, wherein the first fuse and the second fuse are coupled to a current-carrying node of the transistor.

15. The method of claim 14, wherein a first bit line of the non-volatile memory is coupled to the first fuse, a second bit line of the non-volatile memory is coupled to the second fuse, and a word line of the non-volatile memory is coupled to a gate node of the transistor.

16. The method of claim 9, wherein the first and second fuses each comprise a fuse link and a plurality of conductive spacers, wherein the plurality of conductive spacers electrically isolate the fuse link from one or more other semiconductor components of the integrated circuit.

17. A non-volatile memory, comprising:
    a plurality of memory cells that include a first memory cell and a second memory cell;
    the first memory cell including a first eFuse fabricated on a first conductive layer of the non-volatile memory;
    the second memory cell including a second eFuse fabricated on a second conductive layer of the integrated circuit, wherein the first and second conductive layers are different layers of the integrated circuit.

18. The non-volatile memory of claim 17, wherein the first and second eFuses are coupled to a transistor fabricated on a front-end-of-the-line (FEOL) structure of the non-volatile memory.

19. The non-volatile memory of claim 18, wherein:
    the plurality of memory cells include a third memory cell and a fourth memory cell;
    the third memory cell including a third eFuse coupled to the transistor, wherein the third eFuse is fabricated on the first conductive layer;
    the fourth memory cell including a fourth eFuse coupled to the transistor, wherein the fourth eFuse is fabricated on the second conductive layer.

20. The non-volatile memory of claim 18, wherein:
    the plurality of memory cells include a third memory cell and a fourth memory cell;
    the third memory cell including a third eFuse coupled to a second transistor, wherein the third eFuse is fabricated on the first conductive layer and the second transistor is fabricated on the FEOL structure;
    the fourth memory cell including a fourth eFuse coupled to the second transistor, wherein the fourth eFuse is fabricated on the second conductive layer.

* * * * *